(12) United States Patent
Lim et al.

(10) Patent No.: US 12,170,233 B2
(45) Date of Patent: Dec. 17, 2024

(54) PLASMA TREATMENT APPARATUS, A METHOD OF MONITORING A PROCESS OF MANUFACTURING A SEMICONDUCTOR DEVICE BY USING THE SAME, AND A METHOD OF MANUFACTURING A SEMICONDUCTOR DEVICE INCLUDING THE MONITORING METHOD

(71) Applicant: SAMSUNG ELECTRONICS CO., LTD., Suwon-si (KR)

(72) Inventors: Meehyun Lim, Seoul (KR); Sung-Yeol Kim, Yongin-si (KR); Sunghyup Kim, Hwaseong-si (KR); Hyung-Jung Yong, Seongnam-si (KR); Hosun Yoo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 585 days.

(21) Appl. No.: 17/394,471

(22) Filed: Aug. 5, 2021

(65) Prior Publication Data

US 2022/0181219 A1     Jun. 9, 2022

(30) Foreign Application Priority Data

Dec. 8, 2020 (KR) .................. 10-2020-0170390

(51) Int. Cl.
*H01J 1/00* (2006.01)
*G01N 21/25* (2006.01)
(Continued)

(52) U.S. Cl.
CPC ........... *H01L 22/26* (2013.01); *G01N 21/255* (2013.01); *G01N 21/27* (2013.01);
(Continued)

(58) Field of Classification Search
CPC ..... H01L 22/26; H01L 21/6831; H01L 22/12; G01N 21/255; G01N 21/27;
(Continued)

(56) References Cited

U.S. PATENT DOCUMENTS 5,985,032 A   11/1999  Eriguchi
6,099,596 A    8/2000  Li et al.
(Continued)

FOREIGN PATENT DOCUMENTS

JP    2004128166 A    4/2004
JP    2006173223 A    6/2006

OTHER PUBLICATIONS

Kai Chena et al., "Application of terahertz time-domain spectroscopy in atmospheric pressure plasma jet diagnosis", Results in Physics 16 (2020) 102928.

*Primary Examiner* — Alexander H Taningco
*Assistant Examiner* — Pedro C Fernandez
(74) *Attorney, Agent, or Firm* — Wolf, Greenfield & Sacks, P.C.

(57) ABSTRACT

A plasma treatment apparatus includes a light generator that generates light, a chamber that receives the light generated from the light generator, an optical element provided between the light generator and the chamber, a light detector that detects the light reflected in the chamber, and a controller connected to the light generator and the light detector. The chamber includes an electrostatic chuck provided in a lower portion of the chamber, an edge ring provided around the electrostatic chuck, an outer wall for sealing an inner space of the chamber, and a gas supply that injects a process gas into the chamber. The optical element branches the generated light to irradiate branched light to different regions of the chamber.

13 Claims, 8 Drawing Sheets

(51) Int. Cl.
*G01N 21/27* (2006.01)
*G01N 21/3504* (2014.01)
*G01N 21/3586* (2014.01)
*H01J 37/32* (2006.01)
*H01L 21/66* (2006.01)
*H01L 21/683* (2006.01)

(52) U.S. Cl.
CPC ..... *G01N 21/3504* (2013.01); *G01N 21/3586* (2013.01); *H01J 1/00* (2013.01); *H01J 37/3211* (2013.01); *H01J 37/32119* (2013.01); *H01J 37/3244* (2013.01); *H01J 37/32715* (2013.01); *H01J 37/32917* (2013.01); *H01L 21/6831* (2013.01); *G01N 2201/0636* (2013.01); *H01J 2237/2007* (2013.01)

(58) Field of Classification Search
CPC ........... G01N 21/3504; G01N 21/3586; G01N 2201/0636; H01J 37/3211; H01J 37/32119; H01J 37/3244; H01J 37/32715; H01J 37/32917; H01J 2237/2007; H01J 37/32935; H01J 37/32174; H01J 1/00; G01J 3/45; H05H 1/0025

USPC .......................................................... 438/7
See application file for complete search history.

(56) References Cited

U.S. PATENT DOCUMENTS

| | | | |
|---|---|---|---|
| 6,509,960 | B2 | 1/2003 | Johnson et al. |
| 7,102,132 | B2 | 9/2006 | Ludviksson |
| 8,343,306 | B2 | 1/2013 | Tanaka et al. |
| 9,163,931 | B2 | 10/2015 | Matsudo et al. |
| 10,184,786 | B2 | 1/2019 | Matsudo |
| 10,481,005 | B2 | 11/2019 | Oh et al. |
| 2016/0177449 | A1* | 6/2016 | Ohmori ............. H01J 37/32926 118/723 VE |
| 2021/0074516 | A1* | 3/2021 | Ikeda ................ H01J 37/32449 |
| 2021/0074518 | A1* | 3/2021 | Kawakami ........ C23C 16/45563 |
| 2021/0074594 | A1* | 3/2021 | Park ................... G01N 21/9501 |
| 2021/0193444 | A1* | 6/2021 | Meng ................ H01J 37/32972 |
| 2021/0313146 | A1* | 10/2021 | Sato ................... H01J 37/32082 |

* cited by examiner

PLASMA TREATMENT APPARATUS, A METHOD OF MONITORING A PROCESS OF MANUFACTURING A SEMICONDUCTOR DEVICE BY USING THE SAME, AND A METHOD OF MANUFACTURING A SEMICONDUCTOR DEVICE INCLUDING THE MONITORING METHOD

CROSS-REFERENCE TO RELATED APPLICATION

A claim for priority under 35 U.S.C. § 119 is made to Korean Patent Application No. 10-2020-0170390, filed on Dec. 8, 2020, in the Korean Intellectual Property Office, the entirety of which is hereby incorporated by reference.

BACKGROUND

The present disclosure relates to a plasma treatment apparatus, and more particularly to a plasma treatment apparatus, a method of monitoring a process of manufacturing a semiconductor device by using a plasma treatment apparatus, and a method of manufacturing a semiconductor device which includes the monitoring method.

Plasma, which may be defined as an ionized gas state including ions, electrons and/or radicals, may be generated by a very high temperature, a strong electric field, or a radio-frequency (RF) electromagnetic field. A plasma treatment apparatus may typically be used to deposit a reactant in a plasma state on a semiconductor substrate or an apparatus for cleaning, ashing or etching.

As the difficulty of processing using plasma has increased, there has been increased demand for techniques that precisely control a plasma treatment process and accurately measure a state of a semiconductor substrate undergoing a plasma treatment process. Consequently, there has been increased interest in plasma treatment apparatuses and methods of monitoring a process of manufacturing a semiconductor device using plasma treatment processes. In particular, there has been increased interest in plasma treatment apparatuses using far-infrared (far-IR) and methods of monitoring a process of manufacturing a semiconductor device by using the same.

SUMMARY

Embodiments of the inventive concepts provide a plasma treatment apparatus capable of monitoring internal components and a plasma state in a chamber by using far-infrared light without an observation window, a method of monitoring a process of manufacturing a semiconductor device by using the same, and a method of manufacturing a semiconductor device which includes the monitoring method.

Embodiments of the inventive concepts provide a plasma treatment apparatus that includes a light generator that generates light; a chamber that receives the light generated by the light generator; an optical element disposed between the light generator and the chamber; a light detector that detects the light reflected from inside the chamber; and a controller connected to the light generator and the light detector. The chamber includes an electrostatic chuck in a lower portion of the chamber, an edge ring around the electrostatic chuck, an outer wall that seals an inner space of the chamber, and a gas supply that injects a process gas into the chamber. The optical element branches the light generated by the light generator into branched light, and irradiates the branched light to different regions of the chamber.

Embodiments of the inventive concepts further provide a method of monitoring a process of manufacturing a semiconductor device including generating far-infrared light from a light generator; irradiating the far-infrared light into different regions of a chamber through a plurality of optical elements; detecting far-infrared light reflected from inside the chamber with a light detector; and spectroscopically analyzing the detected far-infrared light. The chamber includes an electrostatic chuck in a lower portion of the chamber, an edge ring around the electrostatic chuck, an outer wall that seals an inner space of the chamber, and a gas supply that injects a process gas into the chamber. The irradiating the far-infrared light includes branching the far-infrared light into branched far-infrared light by the plurality of optical elements to irradiate the different regions of the chamber with the branched far-infrared light.

Embodiments of the inventive concepts still further provide a method of manufacturing a semiconductor device including disposing a semiconductor substrate in a chamber; performing a plasma treatment process on the semiconductor substrate; and monitoring the plasma treatment process. The monitoring the plasma treatment process includes generating far-infrared light from a light generator, irradiating the far-infrared light into different regions of the chamber through a plurality of optical elements, detecting far-infrared light reflected from inside the chamber with a light detector, and spectroscopically analyzing the detected far-infrared light. The chamber includes an electrostatic chuck on which the semiconductor substrate is disposed, an edge ring around the electrostatic chuck, an outer wall that seals an inner space of the chamber, and a gas supply that injects a process gas into the chamber. The irradiating the far-infrared light includes branching the far-infrared light into branched far-infrared light by the plurality of optical elements to irradiate the different regions of the chamber with the branched far-infrared light.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, embodiments of the inventive concepts will be described in more detail with reference to the accompanying drawings.

As is traditional in the field of the inventive concepts, embodiments may be described and illustrated in terms of blocks which carry out a described function or functions. These blocks, which may be referred to herein as units or modules or the like, may be physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
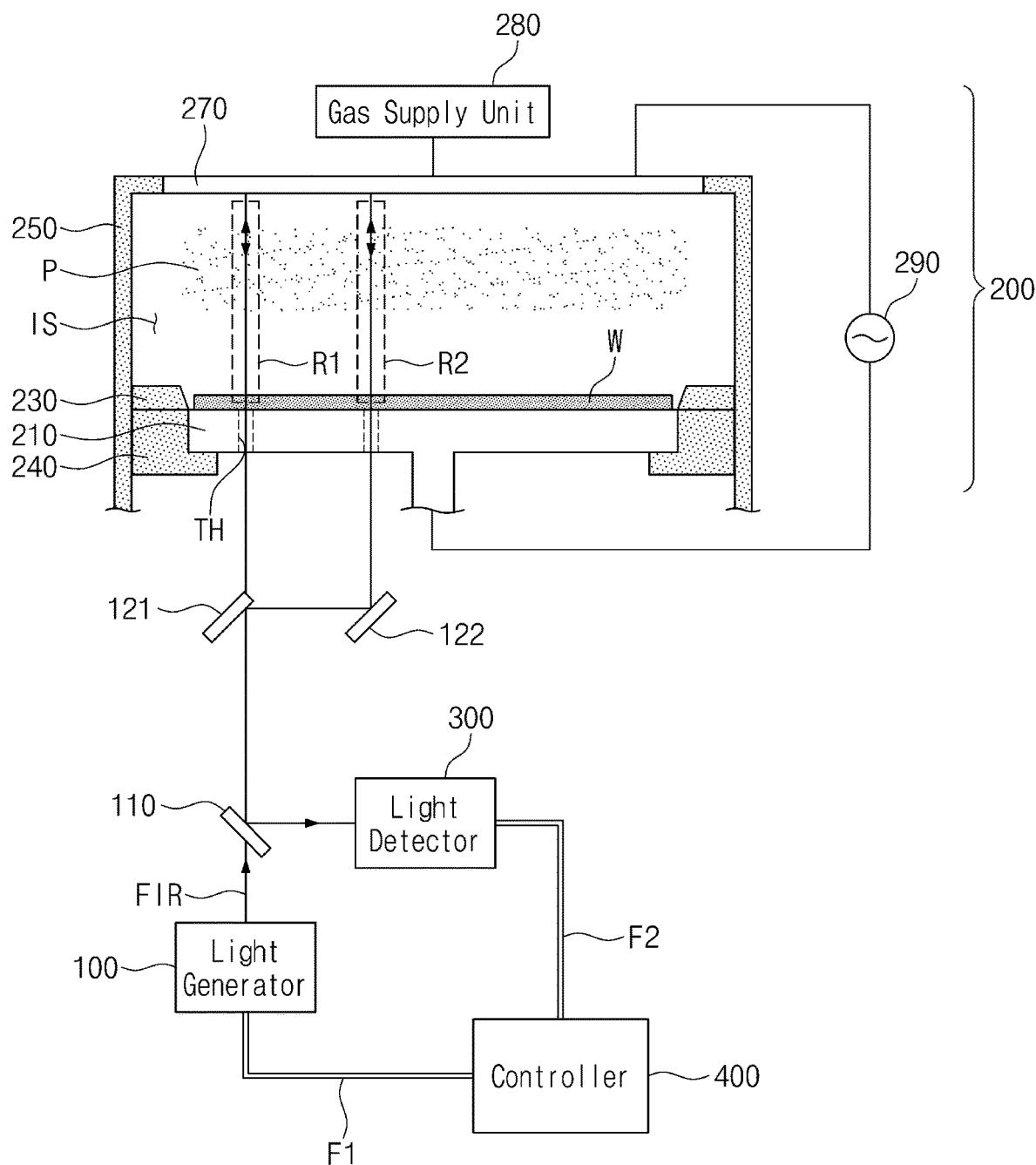
FIG. 1 illustrates a conceptual view of a plasma treatment apparatus according to embodiments of the inventive concepts.

FIG. 1 illustrates a conceptual view of a plasma treatment apparatus according to embodiments of the inventive concepts.

Referring to FIG. 1, a plasma treatment apparatus according to some embodiments of the inventive concepts may include a light generator 100, a chamber 200, a light detector 300, and a controller 400. The plasma treatment apparatus according to the inventive concepts may be, for example, a capacitively coupled plasma (CCP) type plasma treatment apparatus. For example, the light generator 100, the light detector 300 and the controller 400 of the plasma treatment apparatus may be provided under the chamber 200, inside outer wall 250. The light generator 100, the light detector 300 and the controller 400 may be spaced apart from the inner space IS and the electrostatic chuck 210 of the chamber 200.

The light generator 100 may generate light FIR. For example, the light FIR may be far-infrared light. Hereinafter, far-infrared light as disclosed herein should be understood to mean light having a frequency of about 0.1 THz to about 30 THz (or a wavelength of about 10 μm to about 3 mm). Particularly, the far-infrared light may mean light having a frequency of about 0.1 THz to about 1 THz. For example, the light FIR may be pulse light and/or may be composite light including light of different wavelength bands.

The far-infrared light may have little influence on the plasma treatment apparatus itself, and phase delay information as well as a change in the size of a signal may be obtained using the far-infrared light. In other words, more measurable information may be obtained using the far-infrared light, as compared with electromagnetic waves in other wavelength bands. For example, when the far-infrared light is used, it is possible to measure various frequencies and molecular interactions of materials in a semiconductor device as well as changes in resistance, absorption factor and/or refractive index depending on a component and a thickness of a contaminant in the plasma treatment apparatus. In addition, a transmittance of the far-infrared light through a material (e.g., a ceramic material and a semiconductor material) may be higher than that of electromagnetic waves in other wavelength bands, and thus the plasma treatment apparatus may be monitored using the far-infrared light without an observation window.

The light FIR generated from the light generator 100 may be irradiated toward the chamber 200. The plasma treatment apparatus according to the inventive concepts may further include a plurality of optical elements 110, 121 and 122 between the light generator 100 and the chamber 200, and the light FIR may be branched or divided by the plurality of optical elements 110, 121 and 122 so as to be irradiated to different regions of the chamber 200.

For example, the plasma treatment apparatus according to the inventive concepts may include a first optical element 110, a second optical element 121 and a third optical element 122, which are provided between the light generator 100 and the chamber 200. Each of the first optical element 110, the second optical element 121 and the third optical element 122 may be a simple mirror, a dichroic mirror, or a beam splitter. A portion of the light FIR generated from the light generator 100 may pass through the first optical element 110 and the second optical element 121, so as to be irradiated to a region of the chamber 200. Another portion of the light FIR generated from the light generator 100 may pass through the first optical element 110 and then may be reflected at the second optical element 121 and the third optical element 122 so as to be irradiated to another region of the chamber 200.

The first optical element 110 may be disposed adjacent to the light generator 100 and the light detector 300, and the second and third optical elements 121 and 122 may be disposed adjacent to the chamber 200. For example, the first optical element 110 and the second optical element 121 may be aligned with each other in a vertical direction, and the second optical element 121 and the third optical element 122 may be aligned with each other in a horizontal direction. The third optical element 122 may include a driving unit (i.e., a driver) (not shown) and may be movable in the horizontal direction by the driving unit. For example, the third optical element 122 may be spaced apart from the second optical element 121 in the horizontal direction, and a distance between the second optical element 121 and the third optical element 122 may be changed depending on movement of the third optical element 122. Hereinafter, the vertical direction may mean a direction perpendicular to a top surface (or a bottom surface) of the outer wall 250 (to be described later) of the chamber 200, and the horizontal direction may mean a direction parallel to the top surface (or the bottom surface) of the outer wall 250 of the chamber 200.

The chamber 200 may include an electrostatic chuck (ESC) 210, an edge ring 230, a support structure 240, the outer wall 250, a shower head 270, a gas supply unit (i.e., a gas supply) 280, and a power supply unit (i.e., a power supply) 290, and a semiconductor substrate W corresponding to a target of plasma treatment may be provided on the electrostatic chuck 210. The chamber 200 may have a predetermined-sized inner space IS in which a plasma treatment process will be performed on the semiconductor substrate W, and the inner space IS may be surrounded by the electrostatic chuck 210, the edge ring 230, the support structure 240, the outer wall 250, and the shower head 270.

The inner space IS of the chamber 200 may be sealed from the outside and may be maintained in a vacuum state or a state having a predetermined plasma density during a process.

The electrostatic chuck 210 may be provided under the inner space IS surrounded by the outer wall 250 and the shower head 270. The electrostatic chuck 210 may be spaced apart from the shower head 270 in the vertical direction with the inner space IS interposed therebetween. The electrostatic chuck 210 may include, for example, a metal material or a doped semiconductor material. The electrostatic chuck 210 may correspond to a lower electrode electrically connected to the power supply unit 290. The electrostatic chuck 210 may include a portion on which the semiconductor substrate W is provided and which extends in the horizontal direction, and a portion which is located at a center of the portion extending in the horizontal direction and which extends in the vertical direction. The portion extending in the vertical direction may be electrically connected to the power supply unit 290.

The electrostatic chuck 210 may have a plurality of through-holes TH having opened top and bottom ends. For example, the through-holes TH may include through-holes in which support pillars for adjusting a height of the semiconductor substrate W are provided, and/or may include through-holes in which structures for applying separate RF power are provided. For example, the through-holes TH may include a through-hole through which a gas or liquid flows, and/or may include a through-hole through which the light FIR generated from the light generator 100 of the inventive concepts passes. The light FIR irradiated to the chamber 200 through (i.e., via) the second and third optical elements 121 and 122 may pass through the through-holes TH of the electrostatic chuck 210 and then may travel into the inner space IS of the chamber 200.

The edge ring 230 and the support structure 240 may be provided around the electrostatic chuck 210. The edge ring 230 may be provided on the support structure 240. The edge ring 230 may define a position of the semiconductor substrate W provided on the electrostatic chuck 210. In other words, the edge ring 230 may align the semiconductor substrate W at a predetermined position on the electrostatic chuck 210. For example, the edge ring 230 may be spaced apart from the semiconductor substrate W in the horizontal direction by a predetermined gap.

The support structure 240 may be provided under the inner space IS of the chamber 200. The support structure 240 may be provided between the electrostatic chuck 210 and the outer wall 250. The support structure 240 may be fixed to a portion of the outer wall 250 by a coupling member such as a bolt, a nut and/or a screw. The support structure 240 may support an edge of the electrostatic chuck 210 and the edge ring 230. For example, the support structure 240 may also support a portion of a bottom surface of the electrostatic chuck 210.

The edge ring 230 and the support structure 240 may be connected to a portion of the outer wall 250 and may seal the inner space IS. The edge ring 230 and the support structure 240 may include, for example, a ceramic material (e.g., silicon (Si), silicon carbide (SiC), and/or quartz).

The electrostatic chuck 210, the edge ring 230, the support structure 240, the outer wall 250 and the shower head 270 may seal the inner space IS of the chamber 200 from the outside. The shower head 270 may be provided in an upper portion of the chamber 200. A side surface of the shower head 270 may be surrounded by the outer wall 250. A bottom surface of the shower head 270 may be exposed to the inner space IS of the chamber 200, and a top surface of the shower head 270 may be exposed to the outside.

The outer wall 250 may include, for example, a metal material (e.g., aluminum). The shower head 270 may include, for example, a metal material or a doped semiconductor material. The shower head 270 may correspond to an upper electrode electrically connected to the power supply unit 290. The light FIR generated from the light generator 100 and then transmitted through the through-holes TH may be reflected at the bottom surface of the shower head 270.

The gas supply unit 280 may be connected to the shower head 270 and may inject a process gas into the inner space IS of the chamber 200. The power supply unit 290 may be connected to the electrostatic chuck 210 and the shower head 270. The power supply unit 290 may supply power to the electrostatic chuck 210 and the shower head 270 to generate plasma P in the inner space IS of the chamber 200.

The light FIR irradiated into the chamber 200 via the second and third optical elements 121 and 122 may be reflected by the shower head 270 to reciprocate through a first region R1 and a second region R2. An amplitude or a phase of the light FIR reciprocating through each of the first and second regions R1 and R2 may be changed by the plasma P, the semiconductor substrate W or the edge ring 230, which exists in each of the first and second regions R1 and R2.

The first region R1 and the second region R2 may be regions in the chamber 200. For example, the first region R1 may be a region close to an edge of the semiconductor substrate W, and the second region R2 may be a region close to a central portion of the semiconductor substrate W. The positions of the first and second regions R1 and R2 of FIG. 1 are illustrated as examples. However, embodiments of the inventive concepts are not limited thereto, and unlike FIG. 1, in other embodiments the first region R1 may be a region on the edge ring 230 or may be a region including a gap between the edge ring 230 and the semiconductor substrate W.

The light FIR may reciprocate through the first region R1 and the second region R2, and then may travel to the first optical element 110 via the second and third optical elements 121 and 122. The light FIR may be reflected by the first optical element 110 and then may travel to the light detector 300. The light detector 300 may measure information on the amplitude or phase of the light FIR, which is changed by the plasma P, the semiconductor substrate W or the edge ring 230.

The light generator 100 and the light detector 300 may be connected to the controller 400 through a first optical fiber F1 and a second optical fiber F2, respectively. The controller 400 may control an amplitude, a phase, a wavelength, a frequency and/or a pulse shape of the light FIR generated from the light generator 100, and may compare the light FIR measured in the light detector 300 with the light FIR generated by the light generator 100.

Figure 2:
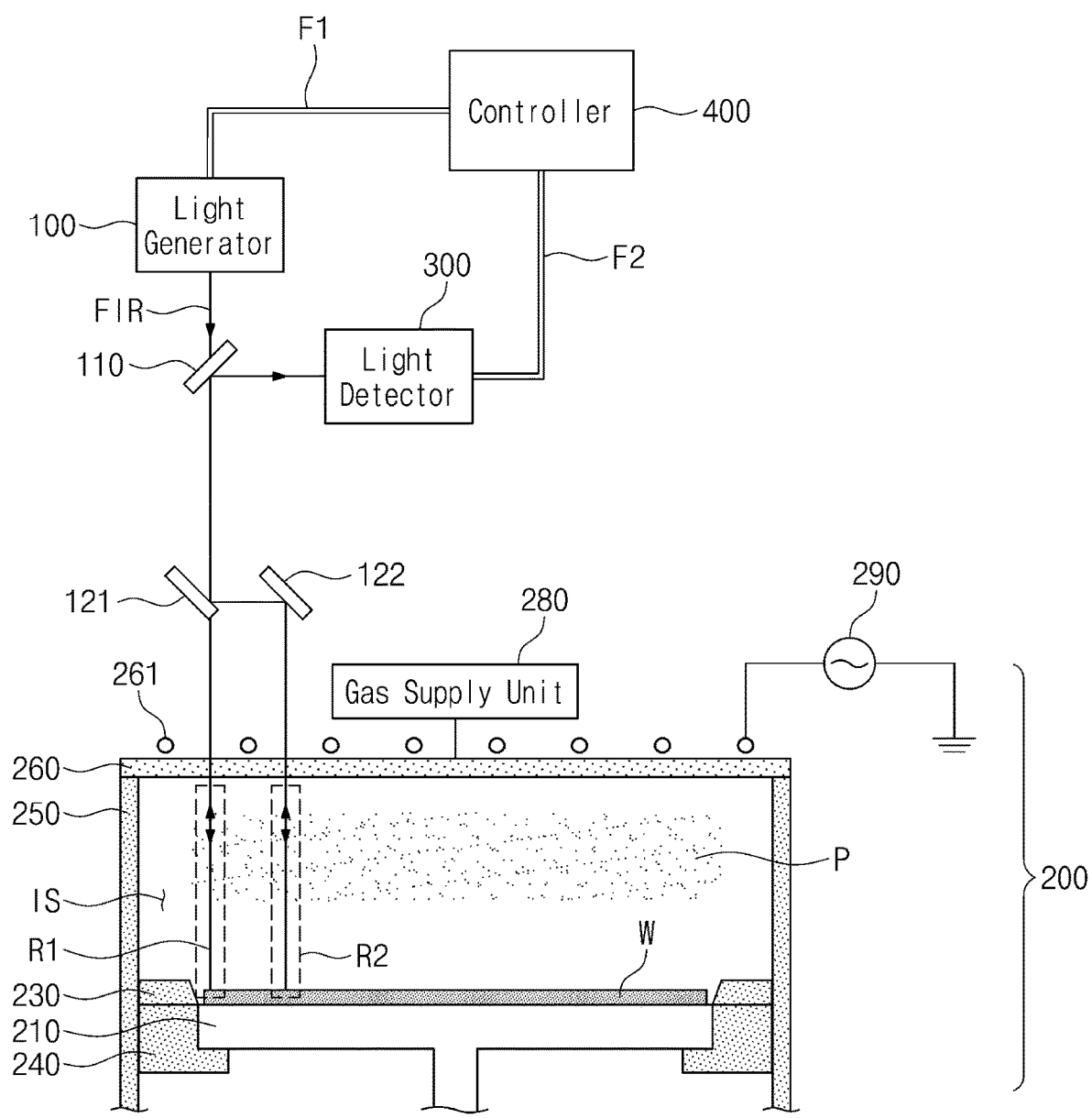
FIG. 2 illustrates a conceptual view of a plasma treatment apparatus according to embodiments of the inventive concepts.

FIG. 2 illustrates a conceptual view of a plasma treatment apparatus according to embodiments of the inventive concepts. Hereinafter, description of features and/or components in FIG. 2 that are substantially the same as mentioned with reference to FIG. 1 may be omitted for the purpose of brevity.

Referring to FIG. 2, a plasma treatment apparatus according to embodiments of the inventive concepts may include a light generator 100, a chamber 200, a light detector 300, a controller 400, and first to third optical elements 110, 121 and 122 between the light generator 100 and the chamber 200. The plasma treatment apparatus according to the inventive concepts as shown in FIG. 2 may be, for example, an inductively coupled plasma (ICP) type plasma treatment apparatus. For example, the light generator 100, the light detector 300 and the controller 400 may be provided above the chamber 200. The light generator 100, the light detector 300 and the controller 400 may be spaced apart from the chamber 200.

The chamber 200 may include an electrostatic chuck 210, an edge ring 230, a support structure 240, an outer wall 250, a window 260, an antenna 261, a gas supply unit 280, and a power supply unit 290. The chamber 200 may have a predetermined-sized inner space IS in which a plasma treatment process will be performed on a semiconductor substrate W, and the inner space IS of the chamber 200 may be sealed from the outside by the electrostatic chuck 210, the edge ring 230, the support structure 240, the outer wall 250 and the window 260.

The window 260 may be provided in an upper portion of the chamber 200 and may be connected to a top of the outer wall 250. The window 260 may be spaced apart from the electrostatic chuck 210 in the vertical direction with the inner space IS interposed therebetween. The window 260 may have substantially the same composition in an entire region of the upper portion of the chamber 200. For example, the window 260 may include a ceramic material (e.g., silicon (Si), silicon carbide (SiC), quartz, and/or aluminum oxide ($Al_2O_3$)). The antenna 261 may be disposed adjacent to a top surface of the window 260 and may be electrically connected to the power supply unit 290. The power supply unit 290 may supply power to the antenna 261 to generate plasma P in the inner space IS of the chamber 200.

Light FIR irradiated to the chamber 200 through the second and third optical elements 121 and 122 may pass through the window 260 to travel into the inner space IS of the chamber 200, and then may be reflected at a top surface of the electrostatic chuck 210.

Figure 3:
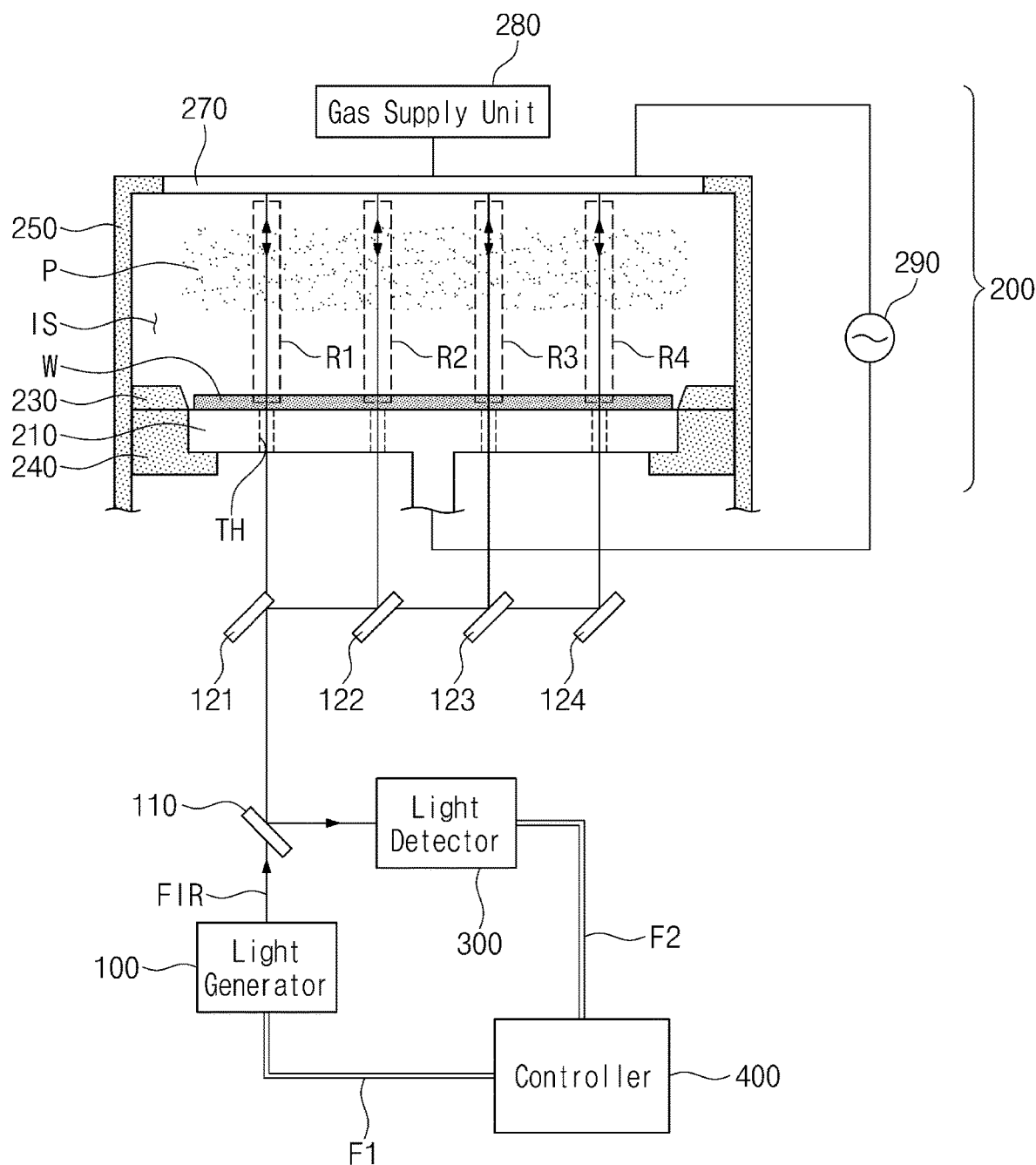
FIG. 3 illustrates a conceptual view of a plasma treatment apparatus according to embodiments of the inventive concepts.

FIG. 3 illustrates a conceptual view of a plasma treatment apparatus according to embodiments of the inventive concepts. Hereinafter, description of features and/or components in FIG. 3 that are substantially the same as mentioned with reference to FIG. 1 may be omitted for the purpose of brevity.

Referring to FIG. 3, a plasma treatment apparatus according to the inventive concepts may include a plurality of optical elements 110, 121, 122, 123 and 124 between the light generator 100 and the chamber 200, and light FIR may be branched or divided by the plurality of optical elements 110, 121, 122, 123 and 124 so as to be irradiated to different regions of the chamber 200.

For example, the plasma treatment apparatus according to the inventive concepts may include a first optical element 110, a second optical element 121, a third optical element 122, a fourth optical element 123 and a fifth optical element 124, which are provided between the light generator 100 and the chamber 200. However, the number of the optical elements is shown as an example, and embodiments of the inventive concepts are not limited to the number of optical elements shown in FIG. 3. For example, the light generator 100, the light detector 300 and the controller 400 of the plasma treatment apparatus may be provided under the chamber 200, inside the outer wall 250. The light generator 100, the light detector 300 and the controller 400 may be spaced apart from the inner space IS and the electrostatic chuck 210 of the chamber 200.

A portion of the light FIR generated from the light generator 100 may pass through the first optical element 110 and the second optical element 121 so as to be irradiated to a region R1 of the chamber 200. Another portion of the light FIR generated from the light generator 100 may pass through the first optical element 110 and then may be reflected by the second optical element 121, and the portion of the light FIR reflected by the second optical element 121 may be reflected at the third, fourth and fifth optical elements 122, 123 and 124 so as to be respectively irradiated to other regions R2, R3 and R4 of the chamber 200.

The first optical element 110 may be disposed adjacent to the light generator 100 and the light detector 300, and the second to fifth optical elements 121, 122, 123 and 124 may be disposed adjacent to the chamber 200 or the electrostatic chuck 210. For example, the first optical element 110 and the second optical element 121 may be aligned with each other in the vertical direction, and the second to fifth optical elements 121, 122, 123 and 124 may be aligned with each other in the horizontal direction. The third to fifth optical elements 122, 123 and 124 may include a driving unit (not shown) and may be movable in the horizontal direction by the driving unit. For example, the third to fifth optical elements 122, 123 and 124 may be spaced apart from the second optical element 121 in the horizontal direction, and distances of the third to fifth optical elements 122, 123 and 124 from the second optical element 121 may be changed depending on movement of the third to fifth optical elements 122, 123 and 124.

The light FIR irradiated to the chamber 200 via the second to fifth optical elements 121, 122, 123 and 124 may be reflected at the shower head 270 to reciprocate through a first region R1, a second region R2, a third region R3 and a fourth region R4. An amplitude or a phase of the light FIR reciprocating through each of the first to fourth regions R1, R2, R3 and R4 may be changed by the plasma P, the semiconductor substrate W or the edge ring 230, which exists in each of the first to fourth regions R1, R2, R3 and R4.

The first to fourth regions R1, R2, R3 and R4 may be regions in the chamber 200. For example, the first region R1 and the fourth region R4 may be regions close to an edge of the semiconductor substrate W, and the second region R2 and the third region R3 may be regions close to a central portion of the semiconductor substrate W. The positions of the first to fourth regions R1, R2, R3 and R4 are illustrated as examples. However, embodiments of the inventive concepts are not limited thereto, and unlike FIG. 3, in other embodiments the first region R1 and the fourth region R4 may be regions on the edge ring 230 or may be regions including a gap between the edge ring 230 and the semiconductor substrate W.

The light FIR may reciprocate through the first to fourth regions R1, R2, R3 and R4, and then may travel to the first optical element 110 via the second to fifth optical elements 121, 122, 123 and 124.

According to the present embodiments, the light FIR may be irradiated to different regions of the chamber 200 via the plurality of optical elements 110, 121, 122, 123 and 124, and thus the different regions (e.g., four regions R1, R2, R3 and R4) of the chamber 200 may be monitored at the same time.

Figure 4:
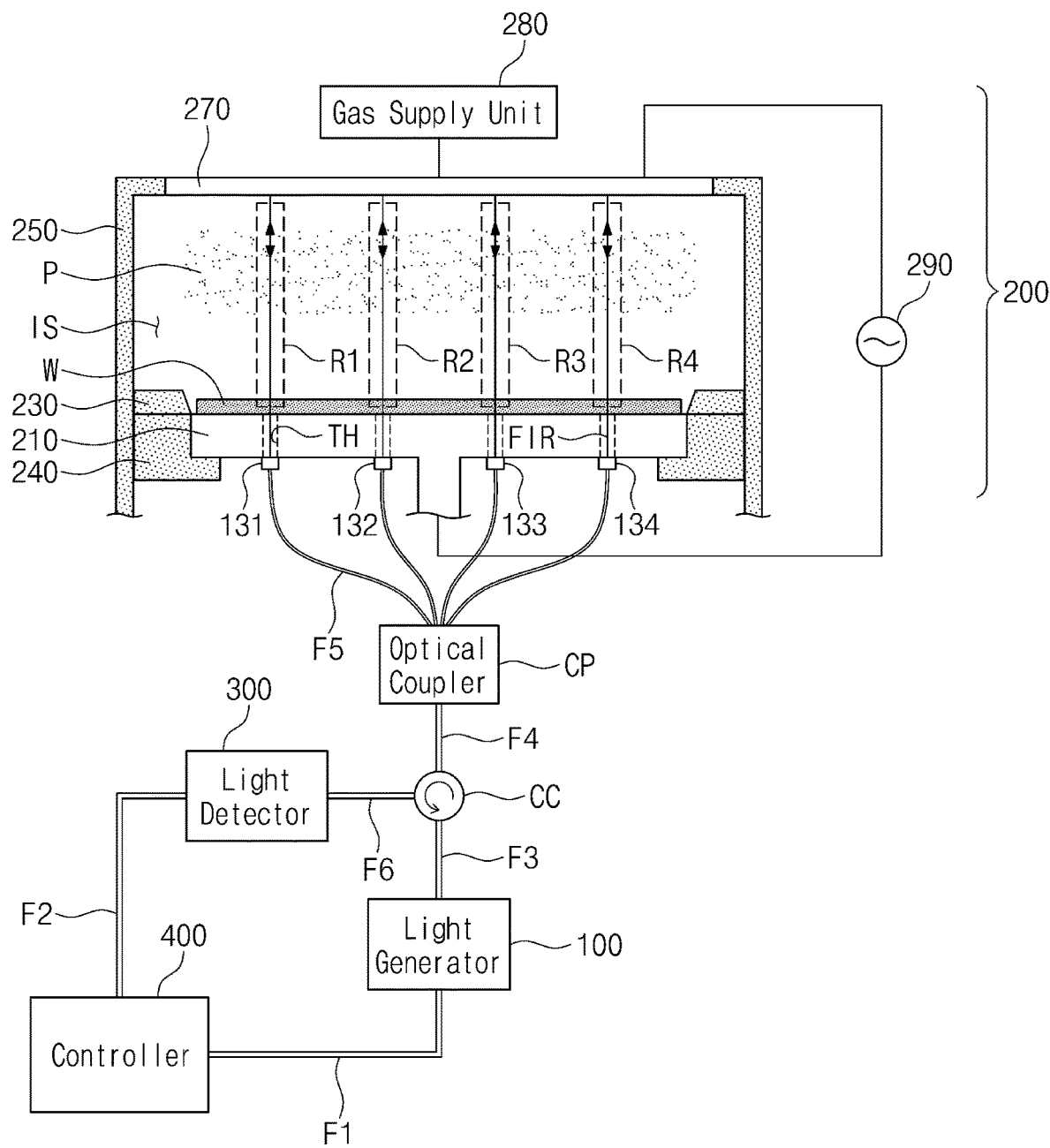
FIG. 4 illustrates a conceptual view of a plasma treatment apparatus according to embodiments of the inventive concepts.

FIG. 4 illustrates a conceptual view of a plasma treatment apparatus according to embodiments of the inventive concepts. Hereinafter, description of features and/or components in FIG. 4 that are substantially the same as mentioned with reference to FIGS. 1 and 3 may be omitted for the purpose of brevity.

Referring to FIG. 4, a plasma treatment apparatus according to some embodiments of the inventive concepts may include an optical circulator CC, an optical coupler CP, a plurality of connectors 131, 132, 133 and 134, and a plurality of optical fibers F3, F4, F5 and F6 connected to the plurality of connectors 131, 132, 133 and 134, the optical coupler CP, the optical circulator CC, which are provided between the light generator 100 and the chamber 200. Light FIR may be branched or divided by the components so as to be irradiated to different regions of the chamber 200.

For example, the light generator 100 may be connected to the optical circulator CC through a third optical fiber F3, and the optical circulator CC may be connected to the optical coupler CP and the light detector 300 respectively through a fourth optical fiber F4 and a sixth optical fiber F6. In addition, the optical coupler CP may be connected to first to fourth connectors 131, 132, 133 and 134 through a plurality of fifth optical fibers F5.

The optical circulator CC may be an optical device designed to output a signal input from one port to another port adjacent to the one port in a counterclockwise direction (or a clockwise direction). In the present embodiment, an optical signal emitted from the light generator 100 and then transmitted through the third optical fiber F3 may travel into the fourth optical fiber F4 via the optical circulator CC, and an optical signal reflected in the chamber 200 and then transmitted through the fourth optical fiber F4 may travel into the sixth optical fiber F6 via the optical circulator CC.

For example, the optical coupler CP may be a 1×N coupler. In other words, a single optical fiber may be connected to one end portion of the optical coupler CP, and a plurality of optical fibers may be connected to another end portion of the optical coupler CP.

For example, the first to fourth connectors 131, 132, 133 and 134 may be provided on a bottom surface of the electrostatic chuck 210 of the chamber 200. The first to fourth connectors 131, 132, 133 and 134 are in direct contact with the bottom surface of the electrostatic chuck 210 in FIG. 4. However, embodiments of the inventive concepts are not limited thereto, and in other embodiments the first to fourth connectors 131, 132, 133 and 134 may be spaced apart from the bottom surface of the electrostatic chuck 210 in the vertical direction or may be provided in the through-holes TH of the electrostatic chuck 210.

Each of the first to fourth connectors 131, 132, 133 and 134 may include a focusing device such as a focusing lens, and thus light FIR output from the fifth optical fibers F5 may not be scattered but may travel in one direction. An optical signal generated from the light generator 100 and then transmitted through the third to fifth optical fibers F3, F4 and F5 may be output into the chamber 200 through the first to fourth connectors 131, 132, 133 and 134. Light FIR reflected by the shower head 270 may be input again into the first to fourth connectors 131, 132, 133 and 134 and then may be input into the light detector 300 through the fifth optical fibers F5, the fourth optical fiber F4 and the sixth optical fiber F6.

In FIG. 4, the fourth optical fiber F4 is connected to an end portion of the optical coupler CP, four of the fifth optical fibers F5 are connected to another end portion of the optical coupler CP, and four connectors 131, 132, 133 and 134 are provided. However, the numbers of the fifth optical fibers F5 and the connectors are not limited thereto.

According to the present embodiment, the light FIR may be provided into the chamber 200 through the optical coupler CP and the optical fibers F3, F4, F5 and F6, and thus a space outside the chamber 200 may be used more flexibly and freely. In some embodiments the fifth optical fibers F5 connected to the connectors 131-134 may extend through the outer wall 250 (i.e., the light generator 100, the light detector 300 and the controller 400 are provided outside of the outer wall 250), and in other embodiments the fifth optical fibers F5 may extend inside of the outer wall 250.

Figure 5:
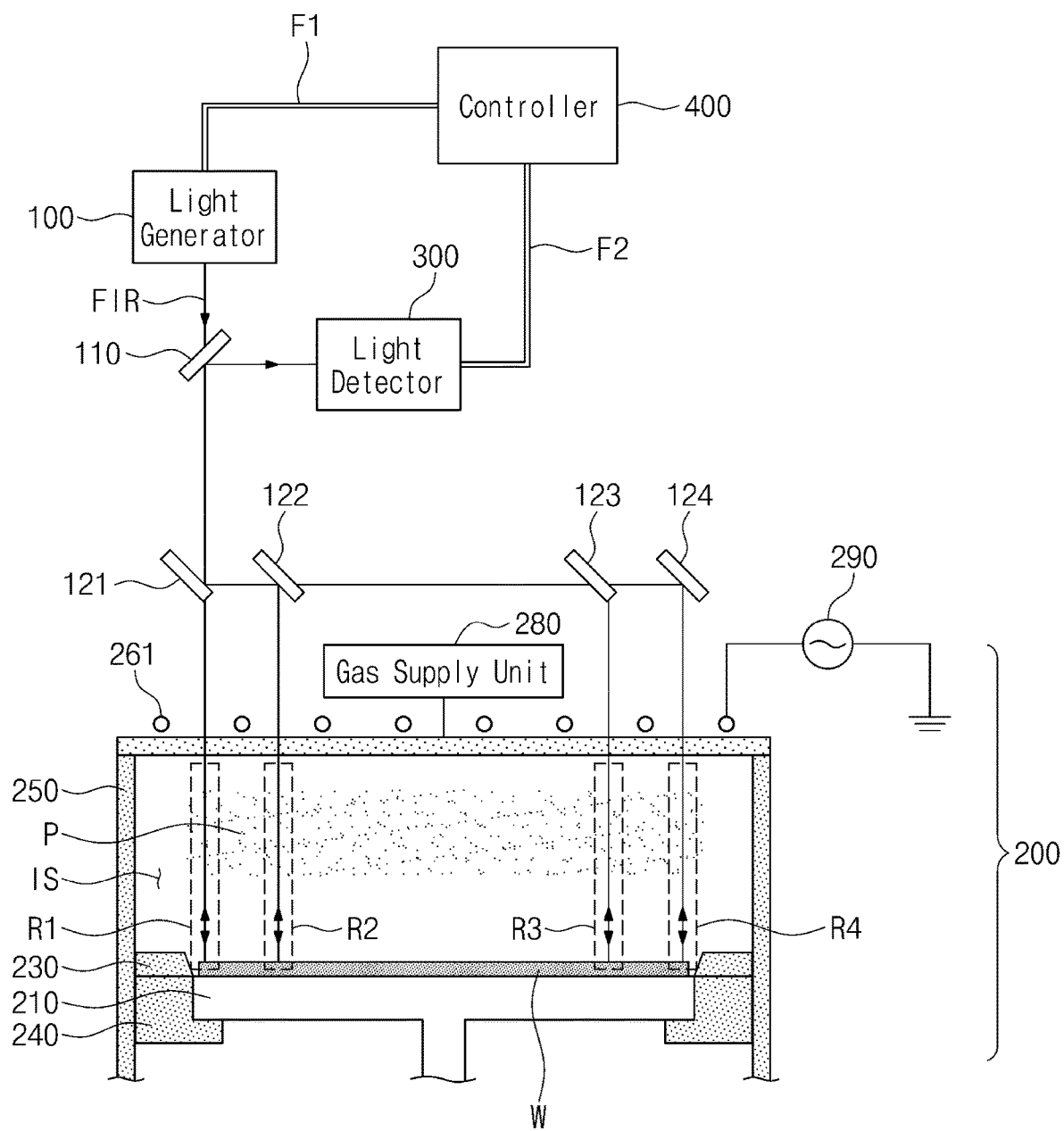
FIG. 5 illustrates a conceptual view of a plasma treatment apparatus according to embodiments of the inventive concepts.

FIG. 5 illustrates a conceptual view of a plasma treatment apparatus according to embodiments of the inventive concepts. Hereinafter, description of features and/or components in FIG. 5 that are substantially the same as mentioned with reference to FIGS. 1, 2 and 3 may be omitted for the purpose of brevity.

Referring to FIG. 5, light FIR irradiated into the chamber 200 via second to fifth optical elements 121, 122, 123 and 124 may be reflected by the electrostatic chuck 210 or the semiconductor substrate W in the chamber 200 to reciprocate through a first region R1, a second region R2, a third region R3 and a fourth region R4. An amplitude or a phase of the light FIR reciprocating through each of the first to fourth regions R1, R2, R3 and R4 may be changed by the plasma P, the semiconductor substrate W or the edge ring 230, which exists in each of the first to fourth regions R1, R2, R3 and R4.

Figure 6:
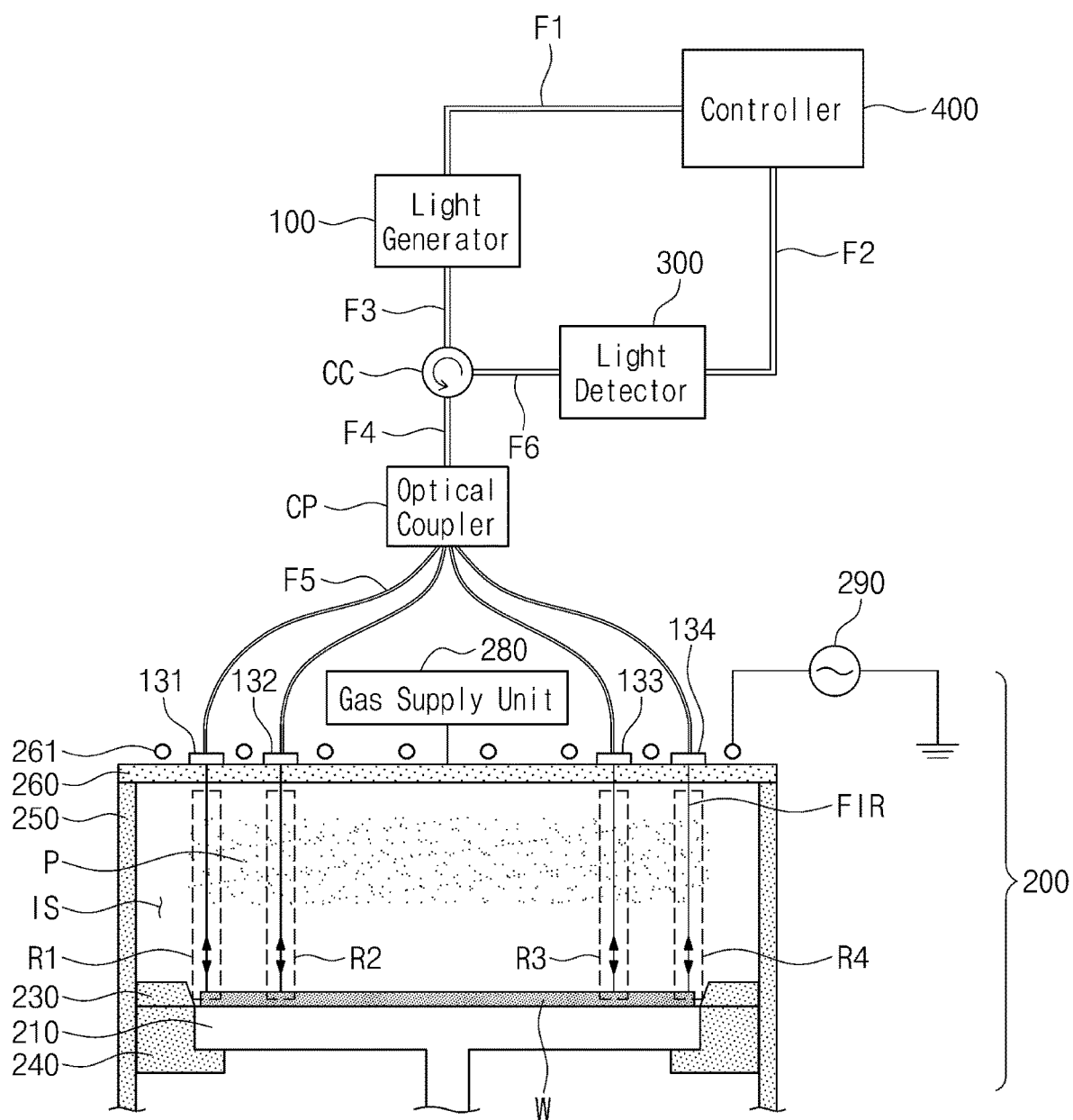
FIG. 6 illustrates a conceptual view of a plasma treatment apparatus according to embodiments of the inventive concepts.

FIG. 6 illustrates a conceptual view of a plasma treatment apparatus according to embodiments of the inventive concepts. Hereinafter, description of features and/or components in FIG. 6 that are substantially the same as mentioned with reference to FIGS. 1, 2 and 4 may be omitted for the purpose of brevity.

Referring to FIG. 6, for example, first to fourth connectors 131, 132, 133 and 134 may be provided on the top surface of the window 260. The first to fourth connectors 131, 132, 133 and 134 are in direct contact with the top surface of the window 260 in FIG. 6. However, embodiments of the inventive concepts are not limited thereto, and in other embodiments the first to fourth connectors 131, 132, 133 and 134 may be spaced apart from the top surface of the window 260 in the vertical direction.

An optical signal generated by the light generator 100 and then transmitted through the third to fifth optical fibers F3, F4 and F5 may be output into the chamber 200 through the first to fourth connectors 131, 132, 133 and 134. Light FIR reflected by the electrostatic chuck 210 or the semiconductor substrate W in the chamber 200 may be input again into the first to fourth connectors 131, 132, 133 and 134, and then may be input into the light detector 300 through the fifth optical fibers F5, the fourth optical fiber F4 and the sixth optical fiber F6.

Figure 7A:
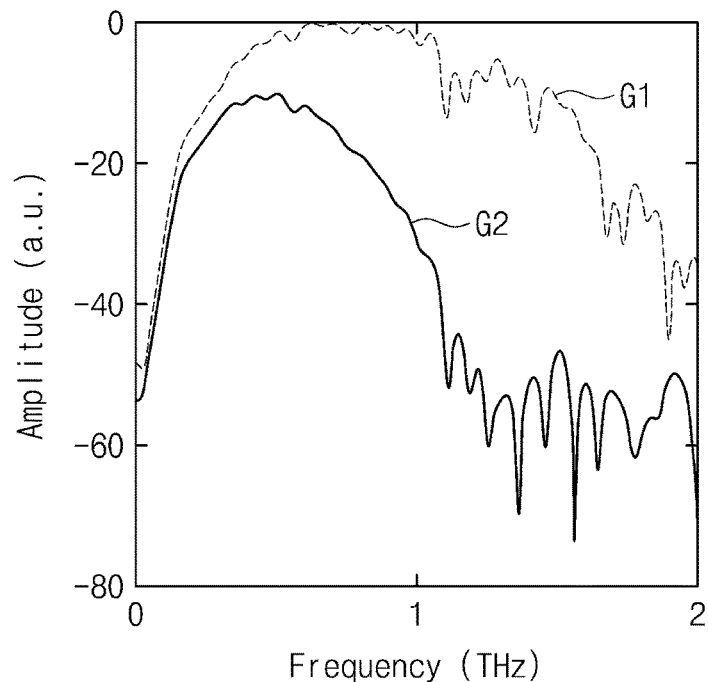
FIGS. 7A and 7B illustrate graphs explanatory of light transmittance of a portion of a plasma treatment apparatus according to embodiments of the inventive concepts.
Figure 7B:
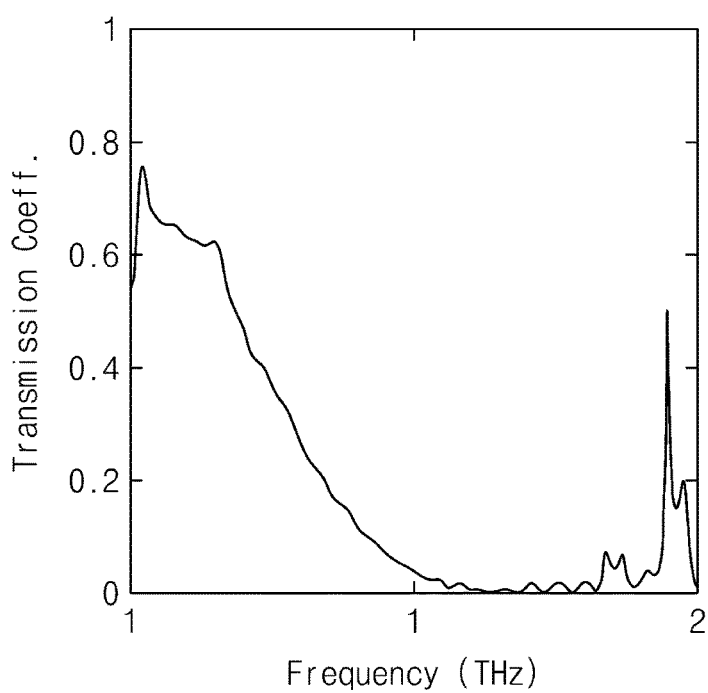

FIGS. 7A and 7B illustrate graphs explanatory of light transmittance of a portion of a plasma treatment apparatus according to embodiments of the inventive concepts. In FIGS. 7A and 7B, the horizontal axes indicate frequency of light in units of terahertz (THz). In FIG. 7A, the vertical axis indicates amplitude of transmitted light in arbitrary units (a.u.), and in FIG. 7B the vertical axis indicates a transmission coefficient.

Referring to FIG. 7A, a first curved line G1 shows an amplitude of light generated from the light generator 100 (see FIG. 1) and then detected by the light detector 300 (see FIG. 1). The first curved line G1 has values measured in a state in which the light generator 100 (see FIG. 1) and the light detector 300 (see FIG. 1) are aligned to face each other and only air exists therebetween.

Meanwhile, a second curved line G2 has values measured in a state in which the light generator 100 (see FIG. 1) and the light detector 300 (see FIG. 1) are aligned to face each other, and a ceramic material (e.g., aluminum oxide ($Al_2O_3$)) is provided therebetween. A thickness of the ceramic material may be substantially equal to a thickness of the window 260 described with reference to FIG. 2.

The amplitude of the light shown by the second curved line G2 may be less than the amplitude of the light shown by the first curved line G1. A difference between the first curved line G1 and the second curved line G2 may generally increase as the frequency increases.

Referring to FIG. 7B, a transmission coefficient of light having a frequency of about 0.1 THz to about 0.5 THz may be greater than about 0.3. A transmission coefficient of light having a frequency of about 0.1 THz to about 1 THz may be greater than a transmission coefficient of light having a frequency greater than about 1 THz. The transmission coefficient of light may generally decrease as the frequency increases. The far-infrared light generated from the light generator 100 (see FIG. 1) according to the inventive concepts may thus have the frequency of about 0.1 THz to about 1 THz.

Figure 8:
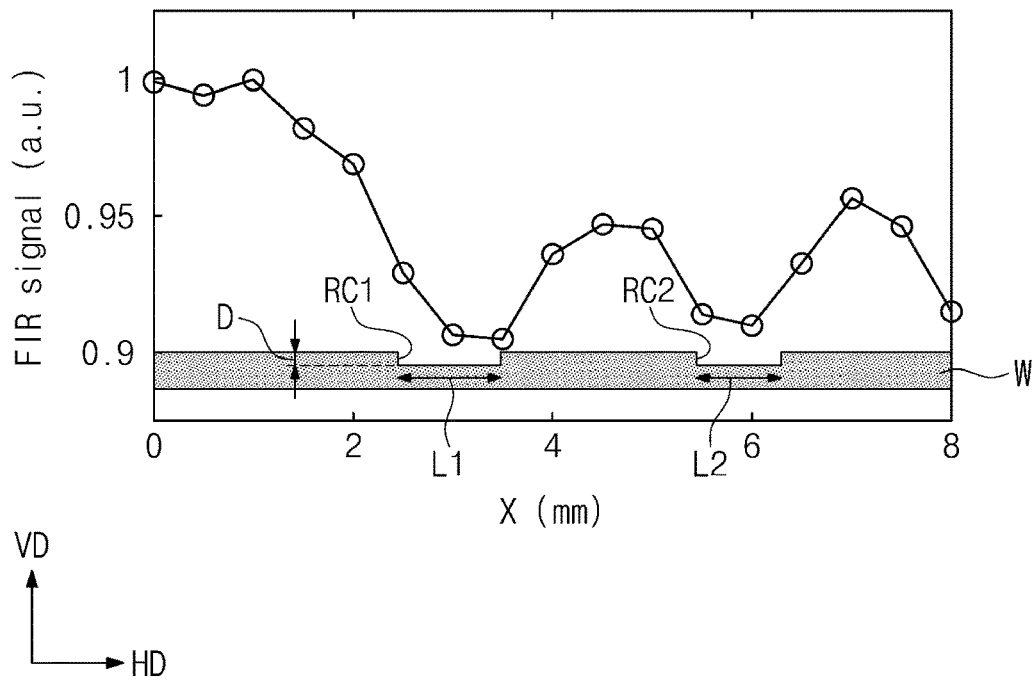
FIG. 8 illustrates a graph explanatory of resolution of a method of monitoring a process of manufacturing a semiconductor device by using a plasma treatment apparatus according to embodiments of the inventive concepts.

FIG. 8 illustrates a graph explanatory of resolution of a method of monitoring a process of manufacturing a semiconductor device by using a plasma treatment apparatus according to some embodiments of the inventive concepts.

A process of scanning recesses (e.g., etched positions or worn positions) formed in a portion of the semiconductor substrate W by using far-infrared light will be described with reference to FIG. 8. The graph of FIG. 8 shows an intensity of a far-infrared light signal at a distance X in a horizontal direction HD from a predetermined point on the semiconductor substrate W. The unit of the distance X is mm. The vertical axis indicates intensity of the FIR light in arbitrary units (a.u.).

For example, the intensity of the far-infrared light signal may be reduced depending on a first recess RC1 having a first length L1 in the horizontal direction HD and a first depth D in a vertical direction VD, and a second recess RC2 having a second length L2 in the horizontal direction HD and the first depth D in the vertical direction VD. For example, the first length L1 is about 1 mm, the second length L2 is about 0.8 mm, and the first depth D is about 0.1 mm (100 μm).

The recesses (e.g., etched positions or worn positions) having a length of about 0.8 mm in the horizontal direction HD and a depth of about 0.1 mm in the vertical direction VD may be detected by a method of monitoring a process of manufacturing a semiconductor device by using the plasma treatment apparatus according to the inventive concepts.

Figure 9:
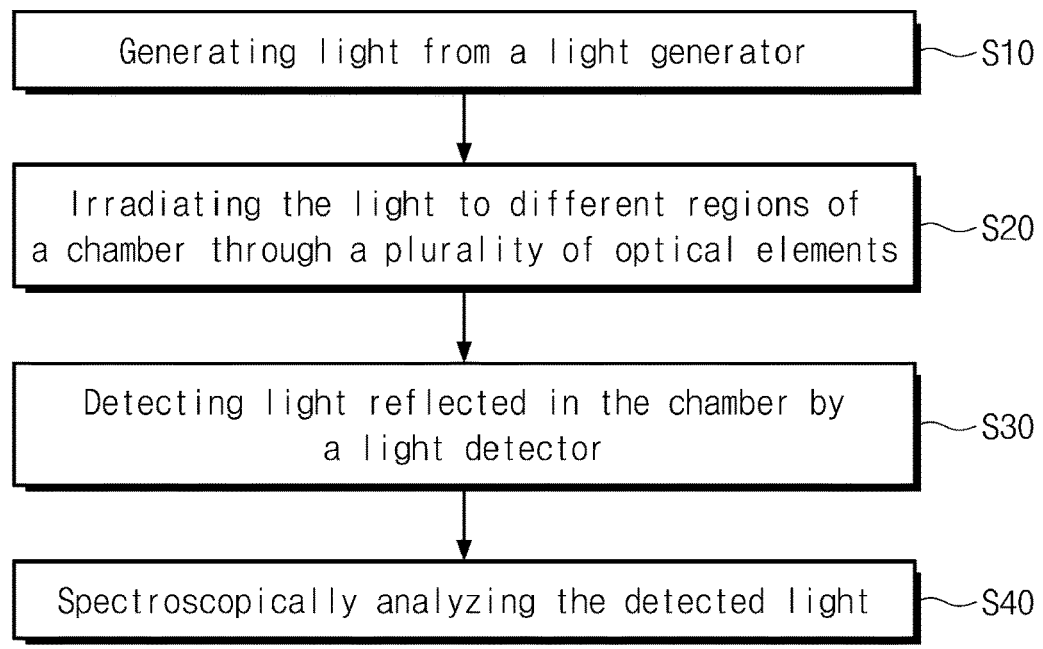
FIG. 9 illustrates a flowchart explanatory of a method of monitoring a process of manufacturing a semiconductor device by using a plasma treatment apparatus according to embodiments of the inventive concepts.

FIG. 9 illustrates a flowchart explanatory of a method of monitoring a process of manufacturing a semiconductor device by using a plasma treatment apparatus according to embodiments of the inventive concepts.

Referring to FIGS. 9 and 1 (or 2), a method of monitoring a process of manufacturing a semiconductor device according to the inventive concepts includes generating light FIR by (i.e., from) the light generator 100 (S10), irradiating the light FIR to different regions of the chamber 200 via the plurality of optical elements 110, 121 and 122 (S20), detecting light FIR reflected in the chamber 200 by (i.e., using) the light detector 300 (S30), and spectroscopically analyzing the detected light FIR (S40).

In addition, a method of manufacturing a semiconductor device according to the inventive concepts may include disposing a semiconductor substrate W in the chamber 200, performing a plasma treatment process on the semiconductor substrate W, and monitoring the plasma treatment process by the aforementioned method of monitoring the process of manufacturing a semiconductor device.

The light FIR may be reflected at the shower head 270 in the chamber 200 of the plasma treatment apparatus of FIG. 1, or may be reflected at the electrostatic chuck 210 or the semiconductor substrate W in the chamber 200 of the plasma treatment apparatus of FIG. 2.

The light FIR generated by (i.e., from) the light generator 100 may be far-infrared light as described with reference to FIG. 1. According to the inventive concepts, the different regions of the chamber 200 may be monitored at the same time by irradiating of the light FIR to the different regions of the chamber 200 via the plurality of optical elements 110, 121 and 122 (S20).

The spectroscopic analyzing of the detected light FIR (S40) may be performed by, for example, terahertz time domain spectroscopy (THz-TDS). For example, an etched thickness may be monitored in real time by measuring a time delay of the light FIR provided as a terahertz pulse signal.

According to the inventive concepts, the uniformity of the plasma P in the chamber 200 and contamination levels, wear levels, positions and/or thicknesses of internal components (e.g., the semiconductor substrate W, the electrostatic chuck 210, the edge ring 230, the shower head 270 (or the window 260) and/or a focus ring (not shown) used in a plasma etching process) of the plasma treatment apparatus may be monitored by spectroscopic analysis of the detected light FIR (S40). Whether replacement of the internal components is necessary may be determined depending on the contamination levels, the wear levels or the thicknesses of the internal components of the plasma treatment apparatus. In addition, expected or predicted replacement times of the internal components may be determined depending on the contamination levels, the wear levels or the thicknesses of the internal components.

Moreover, depending on the positions of the internal components of the plasma treatment apparatus, it is possible to monitor whether a gap between the edge ring 230 and the semiconductor substrate W is constant or uniform, and/or whether the semiconductor substrate W is aligned at a predetermined position on the electrostatic chuck 210. For example, a state of the semiconductor substrate W may be scanned using the movement of the third optical element 122. In addition, by moving the third optical element 122, a progress degree of an etching process on the semiconductor substrate W, and whether the position of the semiconductor substrate W is symmetrical with respect to the electrostatic chuck 210 and the edge ring 230, can be monitored.

Furthermore, the uniformity of a density of the plasma P in a central portion and an edge of the inner space IS of the chamber 200 may be monitored in real time during the plasma treatment process by measuring a change in the phase of the light FIR.

In the plasma treatment apparatus according to the embodiments of the inventive concepts, the far-infrared light may be irradiated into different regions of the chamber through the plurality of optical elements, and thus the different regions of the chamber may be monitored at the same time.

In embodiments of the inventive concepts, the far-infrared light which may pass through certain material may not affect the plasma treatment apparatus itself, and various information of the plasma treatment apparatus may be monitored using the far-infrared light without an observation window.

In the method of monitoring a process of manufacturing a semiconductor device according to the embodiments of the inventive concepts, an etched thickness may be monitored in real time by measuring a time delay of the light provided as a pulse signal, and contamination levels, wear levels, positions and/or thicknesses of the internal components may be monitored by spectroscopically analyzing the detected light. Thus, it is possible to determine whether replacement of the internal components is necessary, and replacement times of internal components may be predictable.

In addition, in the method of monitoring a process of manufacturing a semiconductor device according to the embodiments of the inventive concepts, the uniformity of the density of the plasma in the central portion and the edge of the inner space of the chamber may be monitored in real time during the plasma treatment process by measuring a change in the phase of the far-infrared light.

While the inventive concepts have been described with reference to example embodiments, it should be apparent to those skilled in the art that various changes and modifications may be made without departing from the spirit and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A plasma treatment apparatus comprising:
   a light generator configured to generate light;
   a chamber configured to receive the light generated by the light generator;
   an optical element disposed between the light generator and the chamber;
   a light detector configured to detect reflected light reflected from inside the chamber; and
   a controller connected to the light generator and the light detector,
   wherein the chamber comprises an electrostatic chuck in a lower portion of the chamber, an edge ring around the electrostatic chuck, an outer wall that seals an inner space of the chamber, and a gas supply configured to inject a process gas into the chamber, and
   wherein the optical element is configured to branch the light generated by the light generator into branched light, and irradiate the branched light to different regions of the chamber.

2. The plasma treatment apparatus of claim 1, wherein the light generated by the light generator has a frequency of about 0.1 THz to about 1 THz.

3. The plasma treatment apparatus of claim 1, wherein the light generator and the optical element are under the chamber.

4. The plasma treatment apparatus of claim 3, wherein the optical element comprises a plurality of optical elements, and each of the plurality of optical elements comprises a simple mirror, a dichroic mirror, or a beam splitter.

5. The plasma treatment apparatus of claim 4, wherein at least one of the plurality of optical elements comprises a driver, and the at least one of the plurality of optical elements is movable in a horizontal direction parallel to a bottom surface of the chamber by the driver.

6. The plasma treatment apparatus of claim 3, wherein the chamber further comprises a shower head in an upper portion of the chamber, and a power supply electrically connected to the shower head and the electrostatic chuck,
   wherein the inner space of the chamber is sealed by the shower head and the outer wall, and the power supply is configured to supply power to the shower head and the electrostatic chuck to generate plasma in the inner space of the chamber.

7. The plasma treatment apparatus of claim 6, wherein the shower head includes a metal material or a semiconductor material, and
   the light detector is configured to detect the reflected light that is reflected at the shower head inside the chamber.

8. The plasma treatment apparatus of claim 3, wherein the electrostatic chuck has a plurality of through-holes having opened top and bottom ends, and
   wherein the light generated by the light generator passes through the plurality of through-holes and into the inner space of the chamber.

9. The plasma treatment apparatus of claim 3, wherein the optical element comprises an optical circulator connected to the light generator and the light detector, a plurality of connectors provided on a bottom surface of the electrostatic chuck, and an optical coupler connected to the optical circulator and the plurality of connectors,
   wherein the optical circulator, the plurality of connectors and the optical coupler are connected to each other through optical fibers, and each of the plurality of connectors includes a focusing lens.

10. The plasma treatment apparatus of claim 1, wherein the light generator and the optical element are provided above the chamber, and
    the chamber further comprises a window provided in an upper portion of the chamber, an antenna on a top surface of the window, and a power supply electrically connected to the antenna, and
    wherein the window has substantially a same composition along an entire region of the upper portion of the chamber, the light generated by the light generator passes through the window to be irradiated into the inner space of the chamber, and the power supply is configured to supply power to the antenna to generate plasma in the inner space of the chamber.

11. The plasma treatment apparatus of claim 10, wherein the optical element comprises a plurality of optical elements, and each of the plurality of optical elements comprises a simple mirror, a dichroic mirror, or a beam splitter, and
    wherein at least one of the plurality of optical elements comprises a driver, and the at least one of the plurality of optical elements is movable in a horizontal direction parallel to a top surface of the chamber by the driver.

12. The plasma treatment apparatus of claim 10, wherein the window includes a ceramic material, and the electrostatic chuck includes a metal material or a semiconductor material, and
    wherein at least a portion of the light generated by the light generator and irradiated into the chamber is reflected from the electrostatic chuck or a semiconductor substrate disposed on the electrostatic chuck as the reflected light.

13. The plasma treatment apparatus of claim 10, wherein the optical element comprises an optical circulator connected to the light generator and the light detector, a plurality of connectors on the top surface of the window, and an optical coupler connected to the optical circulator and the plurality of connectors,
    wherein the optical circulator, the plurality of connectors and the optical coupler are connected to each other through optical fibers, and each of the plurality of connectors includes a focusing lens.

* * * * *